US011624025B2

United States Patent
Hirayama et al.

(10) Patent No.: US 11,624,025 B2
(45) Date of Patent: Apr. 11, 2023

(54) COMPOSITION

(71) Applicant: Merck Patent GmbH, Darmstadt (DE)

(72) Inventors: Yuki Hirayama, Tokyo (JP); Tadashi Kishimoto, Kanagawa (JP); Tomohisa Goto, Kanagawa (JP); Masayoshi Suzuki, Tokyo (JP); Teruaki Suzuki, Kanagawa (JP)

(73) Assignee: Merck Patent GmbH, Darmstadt (DE)

( * ) Notice: Subject to any disclaimer, the term of this patent is extended or adjusted under 35 U.S.C. 154(b) by 56 days.

(21) Appl. No.: 16/620,074

(22) PCT Filed: Jun. 5, 2018

(86) PCT No.: PCT/EP2018/064684
§ 371 (c)(1),
(2) Date: Dec. 6, 2019

(87) PCT Pub. No.: WO2018/224459
PCT Pub. Date: Dec. 13, 2018

(65) Prior Publication Data
US 2020/0190400 A1 Jun. 18, 2020

(30) Foreign Application Priority Data

Jun. 8, 2017 (EP) ..................................... 17175028

(51) Int. Cl.
*C09K 11/02* (2006.01)
*C09K 11/70* (2006.01)
*H01L 51/50* (2006.01)
*B82Y 20/00* (2011.01)
*B82Y 40/00* (2011.01)

(52) U.S. Cl.
CPC .......... *C09K 11/025* (2013.01); *C09K 11/703* (2013.01); *H01L 51/502* (2013.01); *B82Y 20/00* (2013.01); *B82Y 40/00* (2013.01)

(58) Field of Classification Search
CPC ..... C09K 11/02; C09K 11/025; C09K 11/703; C09K 11/70; C09K 11/62; C09K 11/0811; C09K 11/565; B81Y 20/00; B81Y 30/00
See application file for complete search history.

(56) References Cited

U.S. PATENT DOCUMENTS

| 8,337,720 | B2 | 12/2012 | McCairn et al. |
| 11,021,651 | B2* | 6/2021 | Jen-La Plante ......... C08L 71/08 |
| 11,041,671 | B2* | 6/2021 | Kim .................... H02P 29/00 |
| 2004/0007169 | A1* | 1/2004 | Ohtsu .................. B82Y 30/00 |
| | | | 117/84 |
| 2004/0250745 | A1* | 12/2004 | Ogura ..................... C30B 7/00 |
| | | | 117/1 |
| 2016/0289552 | A1 | 10/2016 | Werner et al. |

FOREIGN PATENT DOCUMENTS

| JP | 2011513508 A | 4/2011 |
| WO | 09106810 A1 | 9/2009 |
| WO | 14181245 A1 | 11/2014 |

OTHER PUBLICATIONS

International Search Report PCT/EP2018/064684 dated Sep. 12, 2018 (pp. 1-3).
Ou Chen et al.: "Compact high-quality CdSe—CdS core-shell nanocrystals with narrow emission linewidths and suppressed blinking", Nature Materials, vol. 12, No. 5, Feb. 3, 2013 (Feb. 3, 2013), GB, pp. 445-451, XP055500543, ISSN: 1476-1122.
Mehriban Ulusoy et al.: "Aqueous Synthesis of PEGylated Quantum Dots with Increased Colloidal Stability and Reduced Cytotoxicity", Bioconjugate Chemistry, vol. 27, No. 2, Nov. 20, 2015 (Nov. 20, 2015), US, pp. 414-426, XP055500545, ISSN: 1043-1802.
Bing C Mei et al.: "Polyethylene glycol-based bidentate ligands to enhance quantum dot and gold nanoparticle stability in biological media", Nature Protocols, vol. 4, No. 3, Mar. 1, 2009 (Mar. 1, 2009), GB, pp. 412-423, XP055502201, ISSN: 1754-2189.
Hong "Control of Protein Structure and Function through Surface Recognition by Tailored Nanoparticle Scaffolds" J. Am. Chem. Soc., vol. 739, 2004, pp. 126.
Stewart "Multidentate poly(ethylene glycol) ligands provide colloidal stability to semiconductor and metallic nanocrystals in extreme conditions" J. Am. Chem. Soc., vol. 9804, 2010, pp. 132.
Final Rejection in corresponding JP appln. 2019-567741 dated Mar. 29, 2022 (pp. 1-3) and English translation thereof (pp. 1-4).

* cited by examiner

*Primary Examiner* — C Melissa Koslow
(74) *Attorney, Agent, or Firm* — Millen, White, Zelano and Branigan, P.C.; Harry B. Shubin

(57) ABSTRACT

The present invention relates to a composition comprising a nanoparticle.

13 Claims, No Drawings

COMPOSITION

FIELD OF THE INVENTION

The present invention relates to a composition comprising a semiconducting light emitting nanoparticle, formulation, use of a composition, use of a formulation, an optical medium, and an optical device.

BACKGROUND ART

A semiconducting light emitting nanoparticle comprising a core and at least one ligand and a composition comprising a semiconducting light emitting nanoparticle are known in the prior art documents.

For example, J. Am. Chem. Soc. 9804, 132, 2010 discloses CdSe/ZnS and CdSe/CdZnS/ZnS QDs capped with bis(DHLA)-PEG-OCH$_3$.

J. Am. Chem. Soc. 739, 126, 2004 discloses CdSe nanoparticles with thioalkyl and thioalkylated oligo(ethylene glycol) (OEG) ligands for recognition of chymotrypsin (ChT).

And QD beads having Zn-DDT (1-dodecanethiol) polymers are published with US 2016/0289552 A1.

PATENT LITERATURE

1. US 2016-0289552 A1

Non-Patent Literature

2. J. Am. Chem. Soc. 9804, 132, 2010
3. J. Am. Chem. Soc. 739, 126, 2004

SUMMARY OF THE INVENTION

However, the inventors newly have found that there is still one or more of considerable problems for which improvement is desired, as listed below.

1. A novel composition or a formulation, comprising one or more of semiconducting light emitting nanoparticles showing improved dispersibility of said semiconducting light emitting nanoparticles in the composition or the formulation, is desired.
2. A novel composition or a formulation, comprising one or more of semiconducting light emitting nanoparticles showing improved initial Quantum Yield of said semiconducting light emitting nanoparticles in the composition or the formulation, is requested.
3. A novel composition or a formulation, comprising one or more of semiconducting light emitting nanoparticles showing long term stability and stable Quantum Yield of said semiconducting light emitting nanoparticles in the composition or the formulation, is requested
4. A novel composition or a formulation, comprising one or more of semiconducting light emitting nanoparticles, showing higher Optical Density ("OD") at an excitation wavelength, is desired.
5. A novel composition or a formulation, comprising one or more of semiconducting light emitting nanoparticles, showing better dispersibility of the semiconducting light emitting nanoparticles at higher concentration, is requested.

The inventors aimed to solve one or more of the above mentioned problems 1 to 5.

Then it was found a novel composition comprising, essentially consisting of, or consisting of at least one semiconducting light emitting nanoparticle comprising at least a core, optionally one or more shell layers, a first material, and a second material, wherein the first material is represented by following chemical formula (I);

$$XYZ \qquad (I)$$

wherein X represents an attaching group comprising one or two S atoms, preferably said attaching group is

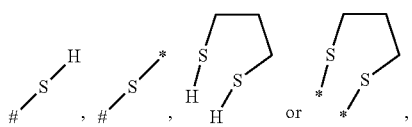

more preferably

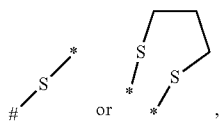

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is —[CH(R$^1$)—CH(R$^2$)-Q]$_x$—R$^3$, wherein R$^1$ is H or a methyl group, R$^2$ is H or a methyl group, Q is an oxygen atom, nitrogen atom or sulfur atom, preferably Q is an oxygen atom, R$^3$ is H or a methyl group, x is an integer, preferably x is in the range from 1 to 300, more preferably from 2 to 200, even more preferably from 4 to 100;

or

Z is —[(CHR$^1$)$_n$-Q)]$_x$—R$^3$ wherein n is 2 or 3, Q is an oxygen atom, nitrogen atom or sulfur atom, preferably Q is an oxygen atom, R$^1$ is H or a methyl group, R$^3$ is H or a methyl group, n is 1 to 5, preferably 1 to 3, more preferably n is 2, x is an integer, preferably x is in the range from 1 to 300, more preferably from 2 to 200, even more preferably from 4 to 100.

In another aspect, the present invention also relates to a novel formulation comprising at least the composition of the present invention, and at least one solvent, preferably it is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether(PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

In another aspect, the present invention also relates to a novel formulation comprising at least one semiconducting light emitting nanoparticle comprising a core, optionally one or more shell layers, and at least one first material, preferably the first material is placed onto the surface of the core or the outermost surface of the shell layers as a ligand, wherein the first material is represented by following chemical formula (I);

XYZ            (I)

wherein X represents an attaching group comprising one or two S atoms, preferably said attaching group is

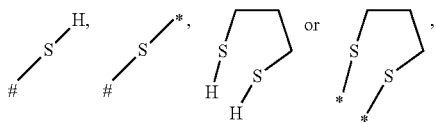

more preferably

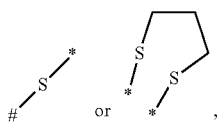

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is —[CH(R$^1$)—CH(R$^2$)-Q]$_x$—R$^3$, wherein R$^1$ is H or a methyl group, R$^2$ is H or a methyl group, Q is an oxygen atom, nitrogen atom or sulfur atom, preferably Q is an oxygen atom, R$^3$ is H or a methyl group, x is an integer, preferably x is in the range from 1 to 300, more preferably from 2 to 200, even more preferably from 4 to 100;

or

Z is —[(CHR$^1$)$_n$-Q)]$_x$—R$^3$ wherein n is 2 or 3, Q is an oxygen atom, nitrogen atom or sulfur atom, preferably Q is an oxygen atom, R$^1$ is H or a methyl group, R$^3$ is H or a methyl group, n is 1 to 5, preferably 1 to 3, more preferably n is 2, x is an integer, preferably x is in the range from 1 to 300, more preferably from 2 to 200, even more preferably from 4 to 100;

and at least one solvent, preferably it is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether(PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxy propanol, more preferably the solvent is selected from propylene glycol alkyl ether acetates.

In another aspect, the present invention relates to use of the composition, or the formulation, in an electronic device, optical device, in a biomedical device or for fabricating an electronic device, optical device or a biomedical device.

In another aspect, the present invention further relates to an optical medium comprising said composition or the formulation.

In another aspect, the present invention also relates to an optical medium comprising an anode and a cathode, and at least one organic layer comprising at least one light emitting nanoparticle comprising at least a core, optionally one or more shell layers and a first material, or a composition according to any one of claims 1 to 9, preferably said one organic layer is a light emission layer, more preferably the medium further comprises one or more layers selected from the group consisting of hole injection layers, hole transporting layers, electron blocking layers, hole blocking layers, electron blocking layers, and electron injection layers, wherein the first material is represented by following chemical formula (I);

XYZ (I)

wherein X represents an attaching group comprising one or two S atoms, preferably said attaching group is

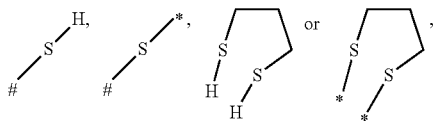

more preferably

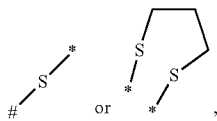

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is $-[CH(R^1)-CH(R^2)-Q]_x-R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;
or Z is $-[(CHR^1)_n-Q)]_x-R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100.

In another aspect, the present invention furthermore relates to an optical device comprising at least one optical medium of the present invention.

DETAILED DESCRIPTION OF THE INVENTION

According to the present invention, in one embodiment, the composition comprises, essentially consists of, or is consisting of at least one semiconducting light emitting nanoparticle comprising at least a core, optionally one or more shell layers, a first material, and a second material, wherein the first material is represented by following chemical formula (I);

XYZ (I)

wherein X represents an attaching group comprising one or two S atoms, preferably said attaching group is

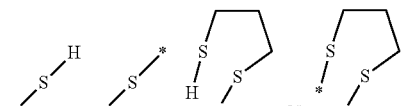

more preferably

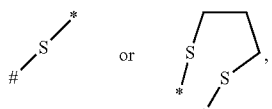

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is $-[CH(R^1)-CH(R^2)-Q]_x-R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;
or Z is $-[(CHR^1)_n-Q)]_x-R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100.

Preferably, said first material represented by chemical formula (I) is placed onto the surface of the core or the outermost surface of the shell layers as a ligand of the semiconducting light emitting nanoparticle.

Preferably, said composition comprises a plurality of the semiconducting light emitting nanoparticles.

Second Material

In some embodiments of the present invention, the second material is selected from one or more members of the group consisting of organic light emitting materials, inorganic light emitting materials, charge transporting materials, such as electron transporting organic materials, scattering particles, host materials, semiconducting inorganic materials, and matrix materials, preferably said matrix material is selected from one or more members of the group consisting of poly-(meth)acrylate, a (meth)acrylate monomer, silicon polymers, epoxy polymers, preferably said matrix first material is a acrylate monomer, methacrylate monomer, polyacrylate, a poly-methacrylate, or a mixture of thereof, more preferably the matrix material is poly-acrylate, a poly-methacrylate or a mixture of thereof.

In a preferred embodiment of the present invention, said second material is a matrix material selected from one or more members of the group consisting of poly-(meth)acrylate, a (meth)acrylate monomer, silicon polymers, epoxy polymers, preferably said matrix material is an acrylate monomer, methacrylate monomer, poly-acrylate, a poly-methacrylate, or a mixture of thereof, more preferably the matrix material is poly-acrylate, a poly-methacrylate or a mixture of thereof.

Therefore, in some embodiments of the present invention, the composition comprises, essentially consists of, or is consisting of;

at least one semiconducting light emitting nanoparticle comprising a core, optionally one or more shell layers, and at least one ligand as the first material placed onto the surface of the core or the outermost surface of the shell layers, wherein the ligand is represented by following chemical formula (I);

XYZ (I)

wherein X represents an attaching group comprising one or two S atoms, preferably the attaching group comprises one or two thiol groups, more preferably it is

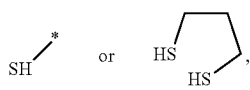

or preferably said attaching group is

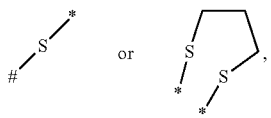

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is —[CH($R^1$)—CH($R^2$)-Q]$_x$—$R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;
or Z is —[(CH$R^1$)$_n$-Q)]$_x$—$R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100; and at least one matrix material selected from one or more members of the group consisting of poly-(meth)acrylate, a (meth)acrylate monomer, silicon polymers, epoxy polymers, preferably said matrix material is an acrylate monomer, methacrylate monomer, poly-acrylate, a poly-methacrylate, or a mixture of thereof, more preferably the matrix material is poly-acrylate, a poly-methacrylate or a mixture of thereof.

Matrix Material

According to the present invention, in some embodiments, the composition comprises at least one matrix material selected from one or more members of the group consisting of poly-(meth)acrylate, a (meth)acrylate monomer, silicon polymers, epoxy polymers, preferably said matrix material is an acrylate monomer, methacrylate monomer, poly-acrylate, a poly-methacrylate, or a mixture of thereof, more preferably the matrix material is poly-acrylate, a poly-methacrylate or a mixture of thereof.

In some embodiments of the present invention, the matrix material comprises a poly-(meth)acrylate, and/or a (meth)acrylate monomer.

According to the present invention, the term "poly-(meth)acrylate" means a general term of polymer obtained by polymerization of monomers selected from the group consisting of acrylic acid, methacrylic acid, acrylate, methacrylate, and a combination of any of these.

Preferably, a poly-(meth)acrylate is a poly-acrylate, or a poly-methacrylate. And preferably, a (meth)acrylate monomer is an acrylate monomer or a methacrylate monomer.

The poly-(meth)acrylate of the present invention, can further comprise another monomer unit which is not described in above, in the range of the poly-(meth)acrylate can show the effect of the present invention.

According to the present invention, the weight-average molecular weight of the poly-(meth)acrylate is not particularly limited.

Preferably, it is in the range from 2,000-100,000, more preferably, it is in the range from 3,000-30,000.

As the poly-(meth)acrylate, publically known one or more of poly-acrylates or poly-methacrylates can be used.

In a preferred embodiment of the present invention, to realize good polymerization reaction with polysiloxane, a silane modified poly-(meth)acrylate, poly-(meth)acrylate which includes a repeating unit containing acid group can be used singly or in a mixture.

As the examples of the silane modified poly-(meth)acrylate, siloxy group and/or silanol group substituted poly-acrylates or poly-methacrylates, poly-acrylates or poly methacrylates reacted with a silane coupling agent including carbon-carbon unsaturated bond, silicone oligomer, or silicone oil, can be used preferably.

Without wishing to be bound by theory, it is believed that the silane modified poly-(meth)acrylate may lead to improved solubility of the polysiloxane.

More preferably, a copolymer made from silane coupling agent and poly-(meth)acrylates can be used.

Here, as the examples of the silane coupling agent, KBM-1003, KME-1003, KBM-1403 or KBM-5103 (from Shinetsu. Co.), and as the examples of the silicone oil, X-22-174DX, X-22-2426, X-22-2475, or X-22-1602 (from Shinetsu. Co.) can be used preferably.

According to the present invention, the number of the unsaturated bond is not particularly limited. From reconcile better reactivity and compatibility with siloxane, the value of double bond equivalent (ethylenically unsaturated bond equivalent) in the (meth)acrylic polymer is in the range from 10 to 500 g/eq preferably.

As the (meth)acrylic polymer which includes a repeating unit containing acid group, (meth)acrylic polymer including a side chain selected from the group consisting of carboxyl group, sulfo group, or phenol type hydroxyl group.

It is believed that the (meth)acrylic polymer which includes a repeating unit containing acid group may lead to better solubility of the uncured part of the photosensitive composition to a developer.

According to the present invention, the number of the acid group is not particularly limited. From reconcile better reactivity and storage stability of the photosensitive composition, the acid value of the (meth)acrylic polymer is in the range from 50 to 500 mg KOH based on 1 g of the (meth)acrylic polymer preferably.

First Material

According to the present invention, the first material, preferably as a ligand of the semiconducting light emitting nanoparticle, is represented by following chemical formula (I);

XYZ (I)

wherein X represents an attaching group comprising one or two S atoms, preferably said attaching group is

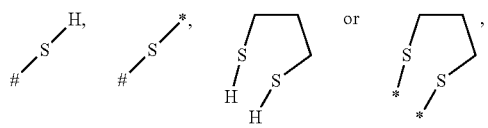

more preferably

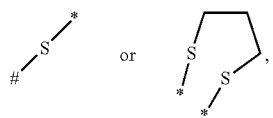

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is —[CH($R^1$)—CH($R^2$)-Q]$_x$—$R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;

or

Z is —[(CHR$^1$)$_n$-Q)]$_x$—$R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100.

In some embodiments of the present invention, preferably said first material is placed onto the surface of the core or the outermost surface of the shell layers of the semiconducting light emitting nanoparticle as a ligand, In some embodiments of the present invention, the surface of the core, or the outermost surface of one or more shell layers of the semiconducting light emitting nanoparticle can be partly or fully over coated by the materials as the ligand.

In some embodiments of the present invention, at least two materials as ligands represented by chemical formula (I) are attached onto the surface of the core or the outermost surface of the shell layers, preferably a plurality of said ligands are attached onto the surface of the core or the outermost surface of the shell layers.

According to the present invention, in some embodiments, the content of said first material, preferably as the ligand, is in the range from 1% to 80% by weight, more preferably in the range from 20% to 70% by weight, even more preferably from 40% to 65% by weight with respect to the total weight of the semiconducting light emitting nanoparticle.

In a preferred embodiment of the present invention, the weight average molecular weight (Mw) of the first material, preferably as the ligand, is in the range from 200 g/mol to 30,000 g/mol, preferably from 250 g/mol to 2,000 g/mol, more preferably from 400 g/mol to 1,000 g/mol.

The molecular weight $M_w$ is determined by means of GPC (=gel permeation chromatography) against an internal polystyrene standard.

In a preferred embodiment, the material, preferably as the ligand, is represented by following formula (Ia) or (Ib)

  (Ia)

  (Ib)

More preferably Z is —[(CHR$^1$)$_n$-Q)]$_x$—$R^3$, wherein n is 2 or 3, Q is an oxygen atom, nitrogen atom or thiol atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 700, more preferably from 2 to 350, even more preferably from 4 to 200.

Preferably, Y is selected from the group of following table 1.

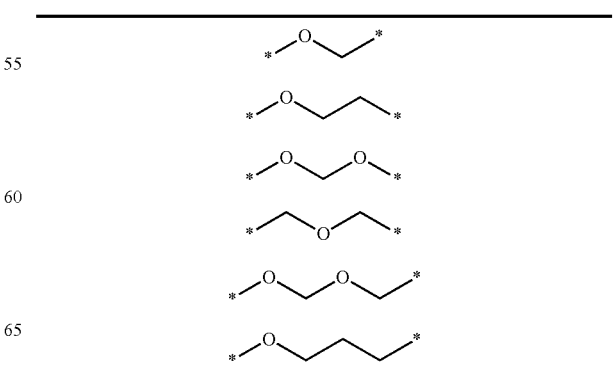

-continued

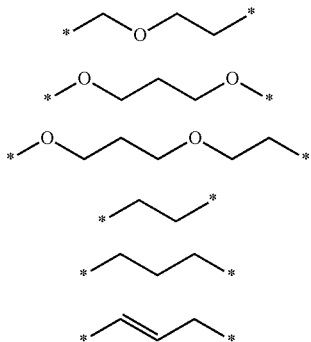

wherein and "*" represents the connecting point to groups X and Z.

Publically available polyethylene glycol (PEG) thiols, polypropylene glycol thiols, and derivatives of thereof (for example from Sigma-Aldrich) can be used preferably as the ligand indicated above.

Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm and 999 nm, preferably 1 nm to 150 nm, more preferably 3 nm to 50 nm.

Thus, according to the present invention, "semiconducting light emitting nanoparticle" is taken to mean that the light emitting material which size is in between 0.1 nm and 999 nm, preferably 1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 999 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN:978-3-662-44822-9.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPZnSe, InCdP, InPCdS, InPCdSe, InGaP, InGaPZn, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$, $TiO_2$ alloys and a combination of any of these can be used.

In a preferred embodiment of the present invention, the core comprises one element of the group 13 of the periodic table, and one element of the group 15 of the periodic table, preferably the element of the group 13 is In, and the element of the group 15 is P, more preferably the core is selected from the group consisting of InP, InPZn, InPZnS, and InGaP.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, the shell layer is represented by following formula (II), $$ZnS_xSe_yTe_z,\quad\text{(II)}$$

wherein the formula (II), 0≤x≤1, 0≤y≤1, 0≤z≤1, and x+y+z=1, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (II'), $$ZnS_xSe_yTe_z,\quad\text{(II')}$$

wherein the formula (II'), 0≤x≤1, 0≤y≤1, 0≤z≤1, and y+z=1, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishells" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/

ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticle is in the range from 0.1 wt. % to 90 wt. % based on the total amount of the composition, preferably from 5 wt. % to 70 wt. %, more preferably from 20 wt. % to 50 wt. %.

Additional Ligand

In some embodiments of the present invention, optionally, the semiconducting light emitting nanoparticle can comprise a different type of ligand in addition to the material represented by the formula (I).

Thus, in some embodiments of the present invention, the outermost surface of the core or the shell layers of the semiconducting light emitting nanoparticle can be over coated with one or more of another ligands together with the ligand represented by the formula (I), if desired.

In case one or more of said another ligand attached onto the core or the outer most surface of the shell layer(s) of the semiconducting light emitting nanoparticle, the amount of the ligand represented by the formula (I) is in the range from 30 wt. % to 99.9 wt % of the total ligands attached onto the outermost surface of the shell layer(s), with preferably being of in the range from 50 wt % to 95 wt %, more preferably it is in the range from 60 wt. % to 90 wt. %.

In some embodiment of the present invention, the composition can further comprise one or more of additives.

Preferably, said additive is selected from the group consisting of said another ligand.

Without wishing to be bound by theory it is believed that such a surface ligands may lead to disperse the nanosized fluorescent material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoicacid; carboxylic acids such as oleic acid, stearic acid, myristic acid; acetic acid and a combination of any of these. And also. Polyethylenimine (PEI) also can be used preferably.

Examples of surface ligands have been described in, for example, the laid-open international patent application No. WO 2012/059931A.

Additional Material

In some embodiments of the present invention, said composition can further comprise at least one additional material, preferably the additional material is selected from the group consisting of organic light emitting materials, inorganic light emitting materials, charge transporting materials, scattering particles, optically transparent polymers, anti-oxidants, radical quenchers, polymerization initiators, and additional ligands.

For example, said activator can be selected from the group consisting of $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Bi^{3+}$, $Pb^{2+}$, $Mn^{2+}$, $Yb^{2+}$, $Sm^{2+}$, $Eu^{2+}$, $Dy^{2+}$, $Ho^{2+}$ and a combination of any of these, and said inorganic fluorescent material can be selected from the group consisting of sulfides, thiogallates, nitrides, oxynitrides, silicate, aluminates, apatites, borates, oxides, phosphates, halophosphates, sulfates, tungstenates, tantalates, vanadates, molybdates, niobates, titanates, germinates, halides based phosphors, and a combination of any of these.

Such suitable inorganic fluorescent materials described above can be well known phosphors including nanosized phosphors, quantum sized materials like mentioned in the phosphor handbook, $2^{nd}$ edition (CRC Press, 2006), pp. 155-pp. 338 (W. M. Yen, S. Shionoya and H. Yamamoto), WO2011/147517A, WO2012/034625A, and WO2010/095140A.

According to the present invention, as said organic light emitting materials, charge transporting materials, any type of publically known materials can be used preferably. For example, well known organic fluorescent materials, organic host materials, organic dyes, organic electron transporting materials, organic metal complexes, and organic hole transporting materials.

For examples of scattering particles, small particles of inorganic oxides such as $SiO_2$, $SnO_2$, $CuO$, $CoO$, $Al_2O_3$ $TiO_2$, $Fe_2O_3$, $Y_2O_3$, $ZnO$, $MgO$; organic particles such as polymerized polystyrene, polymerized PMMA; inorganic hollow oxides such as hollow silica or a combination of any of these; can be used preferably.

Transparent Polymers

According to the present invention, a wide variety of publically known transparent polymers suitable for optical devices can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

In a preferred embodiment of the present invention, any type of publically known transparent polymers, described in for example, WO 2016/134820A can be used.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in

Differential scanning colorimetry like described in http://pslc.ws/macrog/dsc.htm: Rickkey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

Formulation

In another aspect, the present invention relates to a formulation comprising, essentially consisting of, or consisting of at least the composition,
and
at least one solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether(PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

In another aspect, the present invention also relates to a formulation comprising, essentially consisting of, or consisting of at least one semiconducting light emitting nanoparticle comprising a core, optionally one or more shell layers, and at least one first material, preferably said first material is placed onto the surface of the core or the outermost surface of the shell layers as a ligand, wherein the first material is represented by following chemical formula (I);

XYZ (I)

wherein X represents an attaching group comprising one or two S atoms, preferably said attaching group is

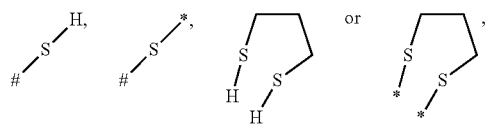

more preferably

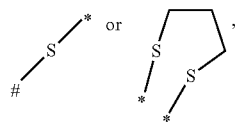

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly) alkoxylene group having 1 to 15 carbon atoms;

Z is $-[CH(R^1)-CH(R^2)-Q]_x-R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;
or Z is $-[(CHR^1)_n-Q)]_x-R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100;
and
at least one solvent, preferably it is selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether(PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, and dichlorobenzene, preferably said solvent is propylene glycol alkyl ether acetates, alkyl acetates, ethylene glycol monoalkyl ethers, propylene glycol, and propylene glycol monoalkyl ethers; preferably the solvent is selected from one or more members of the group consisting of propylene glycol alkyl ether acetates, such as, propylene glycol monomethyl ether acetate (PGMEA), alkyl acetates such as butyl acetate, ethylene glycol monoalkyl ethers such as ethylene glycol monobutyl ether, propylene glycol or propylene glycol monoalkyl ethers such as methoxypropanol, more preferably the solvent is selected from propylene glycol alkyl ether acetates.

Details of the semiconducting light emitting nanoparticle, and the first material, preferably as the ligand, are described in the section of "Semiconducting light emitting nanoparticle" and "First material".

In some embodiments, the formulation can further comprises an additional material. The details of the additional material is described in the section of "Additional material".

Use

In another aspect, the present invention relates to use of the composition, or a formulation, in an electronic device, optical device, in a biomedical device or for fabricating an electronic device, optical device or a biomedical device.

Optical Medium

In another aspect, the present invention further relates to an optical medium comprising at least the composition or the formulation, preferably the optical medium comprises at least the composition.

In some embodiments of the present invention, the optical medium can be an optical sheet, for example, a color filter, color conversion film, remote phosphor tape, or another film or filter.

According to the present invention, the term "sheet" includes film and/or layer like structured mediums.

In another aspect, the present invention also relates to an optical medium comprising an anode and a cathode, and at least one organic layer comprising at least one light emitting nanoparticle comprising at least a core, optionally one or more shell layers and a first material, or a composition according to any one of claims 1 to 9, preferably said one organic layer is a light emission layer, more preferably the medium further comprises one or more layers selected from the group consisting of hole injection layers, hole transporting layers, electron blocking layers, hole blocking layers, electron blocking layers, and electron injection layers, wherein the first material is represented by following chemical formula (I);

$$XYZ \quad (I)$$

wherein X represents an attaching group comprising one or two S atoms, preferably said attaching group is

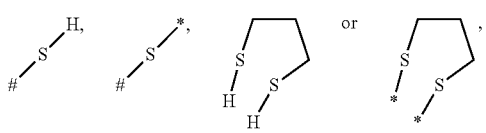

more preferably

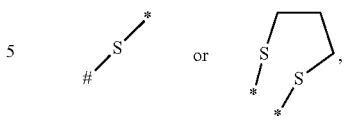

where "#" represents the connecting point to group Y, and "*" represents the connecting point to the surface of the core or the outermost surface of the shell layers of the semiconducting light emitting nanoparticle;

Y is a single bond, an alkylene group having 1 to 15 carbon atoms, or an alkenylene group having 1 to 15 carbon atoms, or (poly)alkoxylene group having 1 to 15 carbon atoms, preferably Y is an (poly)alkoxylene group having 1 to 15 carbon atoms;

Z is —[CH($R^1$)—CH($R^2$)-Q]$_x$—$R^3$, wherein $R^1$ is H or a methyl group, $R^2$ is H or a methyl group, Q is an oxygen atom, nitrogen atom or sulfur atom, preferably Q is an oxygen atom, $R^3$ is H or a methyl group, x is an integer, preferably x is in the range from 1 to 300, more preferably from 2 to 200, even more preferably from 4 to 100;

or

Z is —[(CH$R^1$)$_n$-Q)]$_x$—$R^3$ wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100.

In some embodiments of the present invention, the organic layer comprises at least one light emitting nanoparticle, the first material, and a host material, preferably the host material is an organic host material.

In a preferred embodiment, the organic layer comprises a plurality of the light emitting nanoparticles and first materials.

Optical Device

In another aspect, the invention further relates to an optical device comprising at least one optical medium of the present invention.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

The term "emission" means the emission of electromagnetic waves by electron transitions in atoms and molecules.

Technical Effects of the Invention

1. The present invention provides a novel composition or a formulation comprising one or more of semiconducting light emitting nanoparticles showing improved dispersibility of said semiconducting light emitting nanoparticles in the composition, or the formulation.

2. The present invention provides a novel composition or a formulation, comprising one or more of semiconducting light emitting nanoparticles showing improved initial Quantum Yield of said semiconducting light emitting nanoparticles in the composition or the formulation.

3. The present invention provides a novel composition or a formulation, comprising one or more of semiconducting light emitting nanoparticles showing long term stability and stable Quantum Yield of said semiconducting light emitting nanoparticles in the composition or the formulation.

4. The present invention provides a novel composition or a formulation, comprising one or more of semiconducting light emitting nanoparticles, showing higher Optical Density ("OD") at an excitation wavelength.

5. The present invention provides a novel composition or a formulation, comprising one or more of semiconducting light emitting nanoparticles, showing better dispersibility of the semiconducting light emitting nanoparticles at higher concentration.

The working examples 1-2 below provide descriptions of the present invention, as well as an in detail description of their fabrication.

WORKING EXAMPLES

Working Example 1: Fabrication of a Composition Comprising a Semiconducting Light Emitting Nanoparticle Red InP based quantum materials (hereafter the "QMs") in toluene are prepared like described in U.S. Pat. No. 7,588,828 B.

Ligand Exchange 0.5 g of the red InP based quantum materials in 8.3 mL toluene solution are placed in a flask and toluene is evaporated under reduced pressure. Then, the QMs are dispersed in 17 mL of anhydrous tetrahydrofuran (hereafter "THF"). And the obtained dispersion is mixed with 1 g of methoxy-PEG thiol (from Sigma Aldrich) dissolved in 17 mL THF in a reaction vessel. Then the obtained mixture is refluxed for 19 hours at 85° C. in $N_2$ atmosphere. After 19 hours of stirring, THF is evaporated under reduced pressure.

Then 5 mL of PGMEA is added to the resulting mixture and the obtained solution is refluxed for 4.5 hours at 150° C. in $N_2$ atmosphere.

Isolation of the QMs with Methoxy-PEG Thiol from the Solution

The QMs obtained in the ligand exchange process are precipitated by adding 4.5 mL of octane. After centrifugal separation the resulting sediment is dispersed in 5 mL of PGMEA. Then the obtained QMs are precipitated by adding 6 mL of octane and centrifuged. The resulting sediment is again dispersed in 5 mL of PGMEA, then 7 mL of octane is added and it is centrifuged.

After the centrifugal separation, the resulting sediment is dried under reduced pressure. Finally, 0.61 g of dark red material, which is QMs having methoxy-PEG thiol ligand, is obtained.

Preparation of a Composition Comprising QMs Having Methoxy-PEG Thiol Ligand

The obtained QMs stabilized with methoxy-PEG thiol ligand are dispersed in PGMEA at the concentration of 30 wt. % based on the total amount of the composition and it is stored under $N_2$ atmosphere at 5° C. for QY measurement.

Then sample 1 is taken for the QY measurement. The QMs stabilized with methoxy-PEG thiol ligand disperse in PGMEA homogeneously.

Comparative Example 1: Fabrication of a Composition Comprising a Semiconducting Light Emitting Nanoparticle Red InP based quantum materials (hereafter the "QMs") in toluene are prepared in the same manner as described in U.S. Pat. No. 7,588,828 B.

Ligand Exchange 0.1 g of the red InP based quantum materials in 1.7 mL toluene solution are placed in a flask and toluene is evaporated under reduced pressure.

Then, the QMs are dispersed in 2.5 mL of chloroform, and it is mixed with 0.27 g of Disperbyk-170® (from BYK Japan KK) dissolved in 5 mL of chloroform.

The obtained mixtures stirred for 2 hours at 80° C. in $N_2$ atmosphere.

Then it is cooled down to the room temperature.

Preparation of a Composition Comprising QMs

After cooling down to the room temperature, 0.4 g of PGMEA is added and chloroform is evaporated under vacuum.

The concentration of obtained QMs stabilized with Disperbyk-170® in PGMEA solution is 30 wt. % based on the total amount of the composition and it is stored under $N_2$ atmosphere at 5° C. for QY measurement. Then sample 2, and 3 are taken for the QY measurement.

Working Example 2

Quantum Yield Calculation

The absolute quantum yield of the samples obtained in the working example 1 and comparative example 1 are measured by Hamamatsu instrument via relative technique, The quantum yield of the samples 1 to 3 are evaluated with the absolute PL quantum yields measurement system C9920-02 (Hamamatsu), and following formula is used.

Quantum yield (QY)=emitted photon number from the sample/absorbed photon number of the sample.

Table 2 and 3 show the results of the QY measurements.

TABLE 2

| Minutes | Sample 1 | Sample 2 |
|---|---|---|
| 0 | 0.826 | 0.698 |
| 3 | 0.829 | 0.667 |
| 10 | 0.829 | — |
| 20 | 0.835 | 0.639 |
| 60 | 0.833 | 0.639 |
| 1440 | 0.836 | 0.605 |

TABLE 3

| Days | Sample 1 | Sample 3 |
|---|---|---|
| 0 | 0.834 | 0.759 |
| 1 | — | 0.736 |
| 2 | — | 0.714 |
| 3 | 0.823 | — |

TABLE 3-continued

| Days | Sample 1 | Sample 3 |
|------|----------|----------|
| 7    | 0.85     | 0.702    |
| 14   | 0.83     | 0.725    |
| 21   | —        | 0.722    |

The invention claimed is:

1. A composition comprising at least one semiconducting light emitting nanoparticle comprising at least a core, optionally one or more shell layers, a first material, and a second material,
    wherein the first material is represented by following chemical formula (I):

XYZ  (I)

wherein X represents an attaching group comprising one or two S atoms of the formula

or, where "#" represents the connecting point to group Y, Y is a (poly)alkoxylene group of the formula:

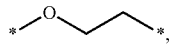

and "*" represents the connecting point to groups X and Z;

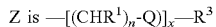

wherein n is 2, Q is an oxygen atom, nitrogen atom or sulfur atom, $R^1$ is H, $R^3$ is a methyl group, x is an integer that is 1 to 100,
    and wherein the second material is selected from one or more members of the group consisting of a poly(meth)acrylate or a (meth)acrylate monomer.

2. The composition according to claim 1, wherein the core comprises one element of the group 13 of the periodic table, and one element of the group 15 of the periodic table a.

3. The composition according to claim 1, wherein at least one of the shell layers comprises a $1^{st}$ element of group 12 of the periodic table, and a $2^{nd}$ element of group 16 of the periodic table.

4. The composition according to claim 1, wherein at least one shell layer is represented by following formula (II), $ZnS_xSe_yTe_z$,  (II)

wherein $0 \leq x \leq 1$, $0 \leq y \leq 1$, $0 \leq z \leq 1$, and $x+y+z=1$.

5. The composition according to claim 1, wherein said shell layers of the semiconducting light emitting nanoparticle are double shell layers.

6. The composition according to claim 1, wherein the composition further comprises at least one additional material, selected from the group consisting of organic light emitting materials, inorganic light emitting materials, charge transporting materials, scattering particles, optically transparent polymers, anti-oxidants, radical quenchers, polymerization initiators, and additional ligands.

7. The composition according to claim 1, wherein the composition comprises a plurality of semiconducting light emitting nanoparticles.

8. The composition according to claim 1, wherein the total amount of the semiconducting light emitting nanoparticle is in the range from 0.1 wt. % to 90 wt. % based on the total amount of the composition.

9. The composition according to claim 1, wherein x is 1-8.

10. A formulation comprising at least the composition according to claim 1 and
    at least one solvent.

11. An electronic device, optical device, or a biomedical device comprising a composition according to claim 1.

12. An optical medium comprising at least said composition according to claim 1.

13. An optical device comprising at least one optical medium according to claim 12.

* * * * *